(12) United States Patent
Ishibashi et al.

(10) Patent No.: US 11,404,340 B2
(45) Date of Patent: Aug. 2, 2022

(54) SEMICONDUCTOR DEVICE AND POWER CONVERSION APPARATUS

(71) Applicant: Mitsubishi Electric Corporation, Tokyo (JP)

(72) Inventors: Hidetoshi Ishibashi, Tokyo (JP); Hiroshi Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/584,576

(22) Filed: Sep. 26, 2019

(65) Prior Publication Data

US 2020/0185295 A1 Jun. 11, 2020

(30) Foreign Application Priority Data

Dec. 7, 2018 (JP) .............................. JP2018-229755

(51) Int. Cl.
*H01L 23/31* (2006.01)
*H02M 7/5387* (2007.01)
(Continued)

(52) U.S. Cl.
CPC .......... *H01L 23/3121* (2013.01); *H01L 24/73* (2013.01); *H02M 7/003* (2013.01); *H02M 7/53871* (2013.01); *H01L 2224/32225* (2013.01)

(58) Field of Classification Search
CPC .......... H02M 7/53871; H01L 23/3121; H01L 24/73; H01L 2224/32225;
(Continued)

(56) References Cited

U.S. PATENT DOCUMENTS 6,301,127 B1 * 10/2001 Kobayashi .............. H01F 27/06
336/192
6,483,185 B1 * 11/2002 Nagase ................... H01L 23/24
257/706

(Continued)

FOREIGN PATENT DOCUMENTS

JP     H07-66507 A     3/1995
JP     2001-127238 A   5/2001
(Continued)

OTHER PUBLICATIONS

An Office Action; "Notice of Reasons for Refusal", mailed by the Japanese Patent Office on Sep. 28, 2021, which corresponds to Japanese Patent Application No. 2018-229755 and is related to U.S. Appl. No. 16/584,576; with English language translation.

*Primary Examiner* — Harry R Behm
(74) *Attorney, Agent, or Firm* — Studebaker & Brackett PC (57) ABSTRACT

An upper conductor portion having a thickness A larger than a thickness B of a lower conductor portion, the upper conductor portion including a circuit pattern on which semiconductor chips are disposed and an outer peripheral pattern provided on an outer peripheral side of the circuit pattern at a certain gap, the outer peripheral pattern of the upper conductor portion, an outer peripheral portion of an insulating layer, and an outer peripheral portion of the lower conductor portion are fixed to a concave portion formed in the inner peripheral portion of the peripheral wall portion of a case, a collar portion projecting outward from the outer peripheral portion of the peripheral wall portion of the case is formed, and the attachment holes, through which the radiation fins are attachable, are formed in the collar portion.

9 Claims, 5 Drawing Sheets

(51) Int. Cl.
*H01L 23/00* (2006.01)
*H02M 7/00* (2006.01)

(58) Field of Classification Search
CPC ......... H01L 2224/73265; H01L 2224/372225; H01L 2224/37225; H02P 27/08
See application file for complete search history.

(56) References Cited

U.S. PATENT DOCUMENTS

| | | | | |
|---|---|---|---|---|
| 6,787,900 | B2 * | 9/2004 | Shinohara | H01L 23/13 257/675 |
| 7,808,100 | B2 * | 10/2010 | Bayerer | H01L 24/48 257/719 |
| 8,847,384 | B2 * | 9/2014 | Yoon | H01L 23/562 257/712 |
| 2003/0094682 | A1 | 5/2003 | Shinohara et al. | |
| 2005/0258550 | A1 | 11/2005 | Morita et al. | |
| 2007/0045746 | A1 * | 3/2007 | Sunohara | H01L 23/481 257/360 |
| 2009/0021916 | A1 * | 1/2009 | Stolze | H01L 23/053 361/709 |
| 2009/0039498 | A1 * | 2/2009 | Bayerer | H01L 24/34 257/700 |
| 2010/0127371 | A1 * | 5/2010 | Tschirbs | H01L 23/3735 257/684 |
| 2010/0133681 | A1 | 6/2010 | Oka et al. | |
| 2010/0252922 | A1 * | 10/2010 | Bayerer | H01L 23/3735 257/692 |
| 2010/0284155 | A1 * | 11/2010 | Stolze | H05K 7/209 361/728 |
| 2010/0302741 | A1 * | 12/2010 | Kanschat | H01L 23/24 361/717 |
| 2016/0365298 | A1 | 12/2016 | Yamada | |
| 2018/0025993 | A1 | 1/2018 | Matsumoto et al. | |
| 2018/0254228 | A1 | 9/2018 | Kuga | |
| 2020/0083146 | A1 * | 3/2020 | Ishibashi | H02M 3/335 |

FOREIGN PATENT DOCUMENTS

| | | |
|---|---|---|
| JP | 2005-332874 A | 12/2005 |
| JP | 2010-129797 A | 6/2010 |
| JP | 2017-005170 A | 1/2017 |
| JP | 2018-014357 A | 1/2018 |
| JP | 2018-147958 A | 9/2018 |

* cited by examiner

SEMICONDUCTOR DEVICE AND POWER CONVERSION APPARATUS

BACKGROUND OF THE INVENTION

Field of the Invention

The present invention relates to a semiconductor device and a power conversion circuit used for control a large current.

Description of the Background Art

For example, there is a semiconductor device used for controlling a large current, on which an Insulated Gate Bipolar Transistor (IGBT) chip or the like is mounted.

In a semiconductor device provided with a semiconductor chip made of SiC in recent years, the amount of heat generation is increased due to the high current density, and high heat dissipation is required. In order to realize high heat dissipation, it is required to improve the thermal conductivity of the material of the parts constituting the semiconductor device. Further, Japanese Patent Application Laid-Open No. 2018-014357 discloses a technique to reduce the thermal resistance by providing a heat spreader under the IGBT chip included in the semiconductor device and diffusing the heat generation of the IGBT chip.

However, if a heat spreader for heat dissipation is provided on the lower side of the IGBT chip as in the technique described in Japanese Patent Application Laid-Open No. 2018-014357, it takes time for assembly and may increase the manufacturing cost of the semiconductor device.

In order to suppress the increase in the manufacturing cost while improving the heat dissipation, it is conceivable to increase the thickness of the circuit pattern of the insulating substrate; however, increase in the thickness of the circuit pattern alone only adds weight to the insulating substrate.

In order to improve the weight of the insulating substrate, it is conceivable to reduce the thickness of the base plate of the insulating substrate which does not contribute much to heat radiation; however, this may make the strength of the junction between the case and the base plate insufficient and the strength of the semiconductor device may possibly be lowered.

SUMMARY

An object of the present invention is to provide a semiconductor device which ensures both the weight reduction and securing necessary strength thereof.

The semiconductor device according to the present invention includes an insulating substrate, semiconductor chips, a case, and a sealing material. The insulating substrate has an insulating layer, an upper conductor portion provided on an upper surface of the insulating layer, and a lower conductor portion provided on a lower surface of the insulating layer. The semiconductor chips are disposed on an upper surface of the insulating substrate. The case surrounds the insulating substrate and the semiconductor chips. The sealing material seals the case inside. The upper conductor portion has a thickness larger than a thickness of the lower conductor portion. The upper conductor portion includes a circuit pattern on which the semiconductor chips are disposed and an outer peripheral pattern provided on an outer peripheral side of the circuit pattern at a certain gap. The outer peripheral pattern of the upper conductor portion, an outer peripheral portion of the insulating layer, and the outer peripheral portion of the lower conductor portion are fixed into a concave portion formed in the inner peripheral portion of the peripheral wall portion of the case. A collar portion protruding outward from an outer peripheral portion of the peripheral wall portion of the case is formed. Mounting holes, through which a cooler is attachable, are formed on the collar portion.

The upper conductor portion includes the circuit pattern on which the semiconductor chips are disposed and the outer peripheral pattern provided on the outer peripheral side of the circuit pattern at the certain gap. Therefore, the rigidity of the outer peripheral portion of the insulating substrate can be enhanced. The outer peripheral pattern of the upper conductor portion has a thickness larger than a thickness of the lower conductor portion. The outer peripheral pattern of the upper conductor portion, the outer peripheral portion of the insulating layer, and the outer peripheral portion of the lower conductor portion are fixed into the concave portion formed in the inner peripheral portion of the peripheral wall portion of the case. Therefore, the concave portion of the peripheral wall portion of the case and the outer periphery of the insulating substrate whose rigidity is enhanced by providing the outer peripheral pattern can be fixed. Thus, external force applied to the semiconductor device can be dispersed, and damage to the insulating layer can be suppressed.

Further, the collar portion protruding outward from the outer peripheral portion of the peripheral wall portion of the case is formed, and the mounting holes, through which a cooler is attachable, are formed on the collar portion. Thereby, the stress at the time of attachment of the cooler can be dispersed, and the damage to the insulating layer can be suppressed. Further, the thickness of the lower conductor portion which does not contribute much to the heat dissipation is formed thinner than the thickness of the upper conductor portion. Therefore, reduction of the weight of the semiconductor device is ensured. As described above, the semiconductor device which ensures both the weight reduction and securing necessary strength thereof can be realized.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
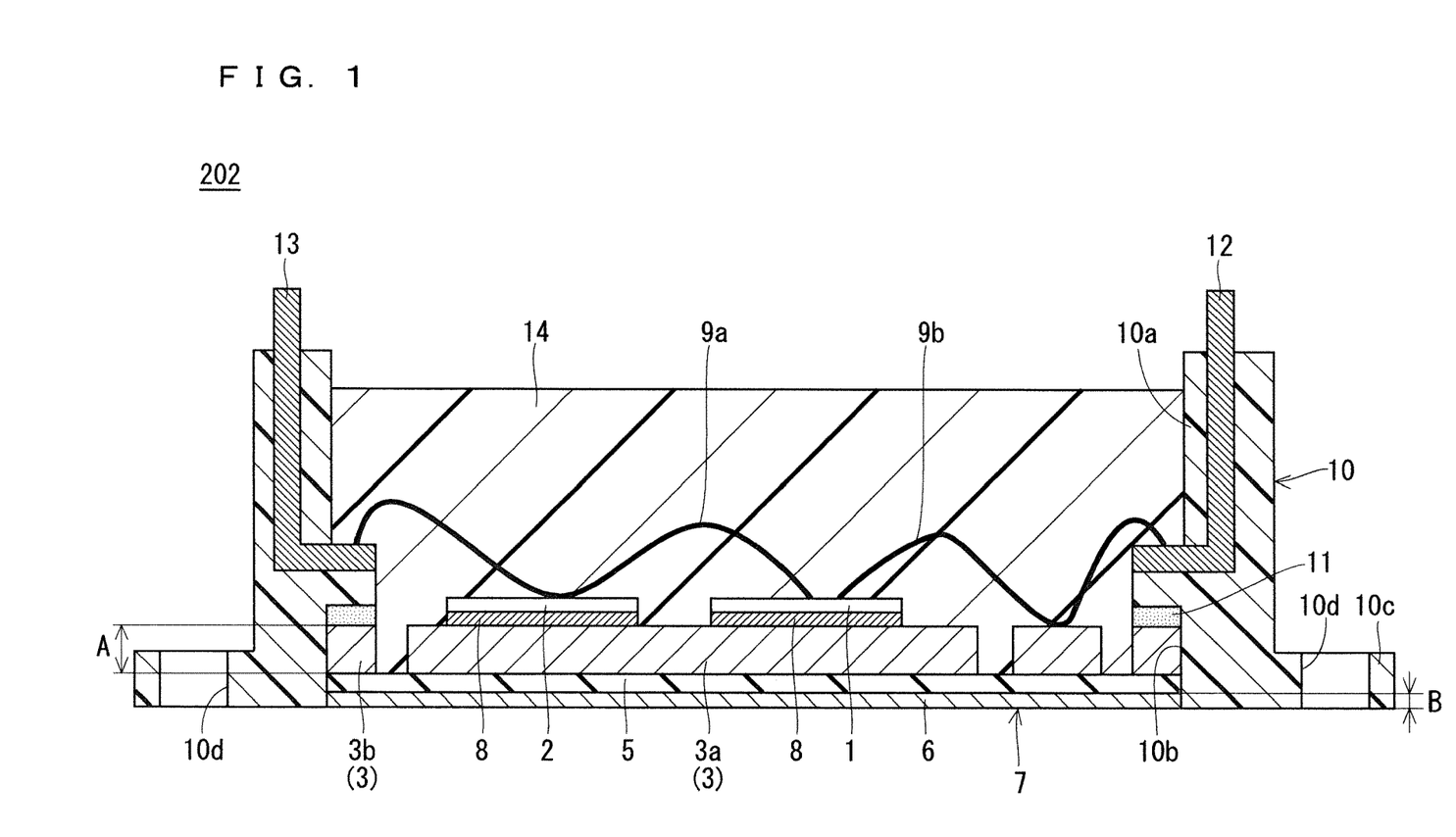
FIG. 1 is a cross-sectional view illustrating a semiconductor device according to Embodiment 1.
Figure 2:
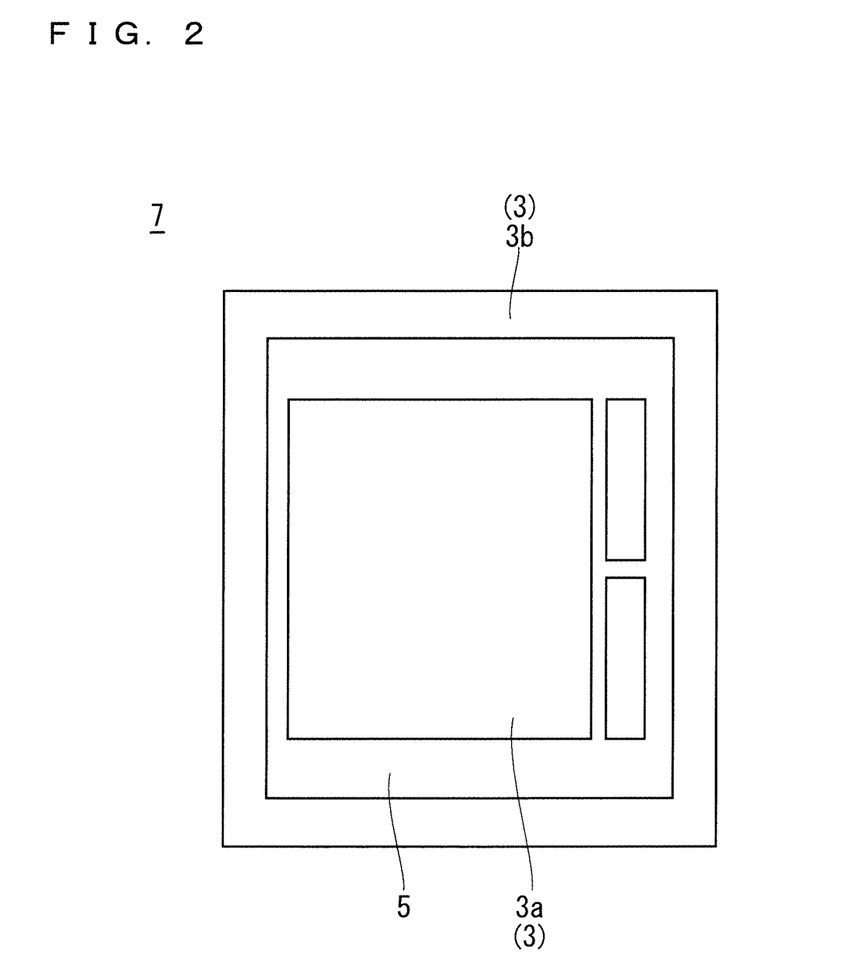
FIG. 2 is a plan view illustrating an insulating substrate included in the semiconductor device according to Embodiment 1.
Figure 3:
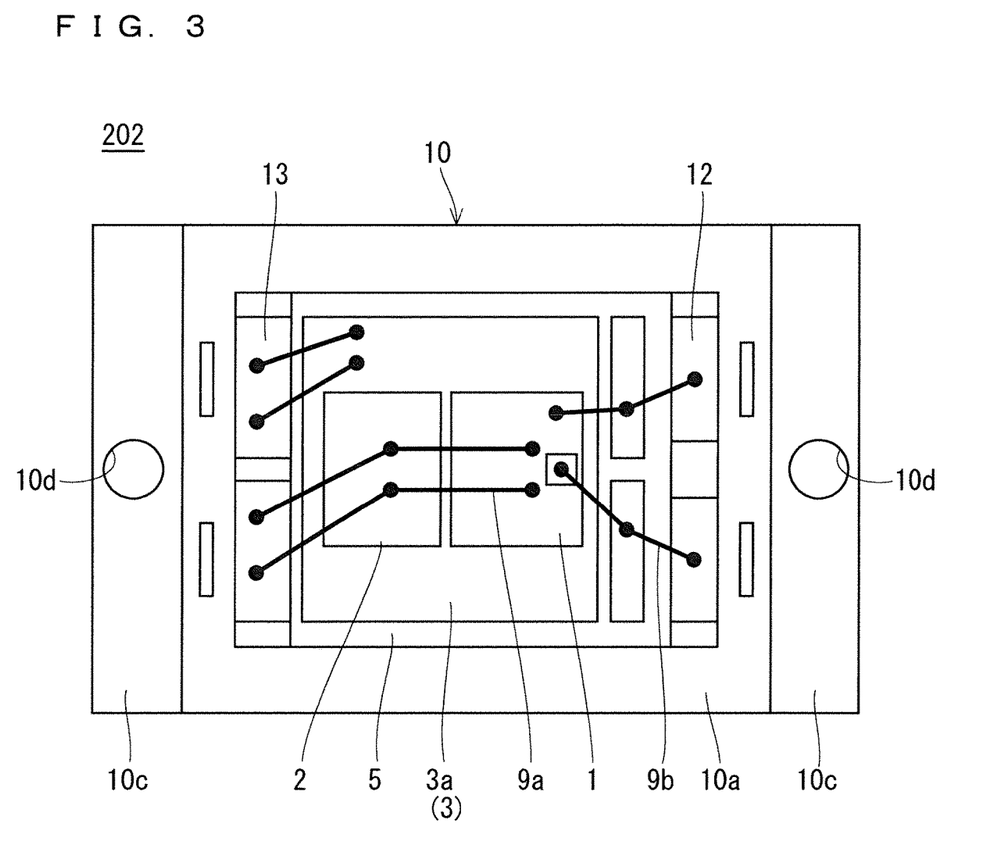
FIG. 3 is a plan view illustrating the semiconductor device according to Embodiment 1.
Figure 4:
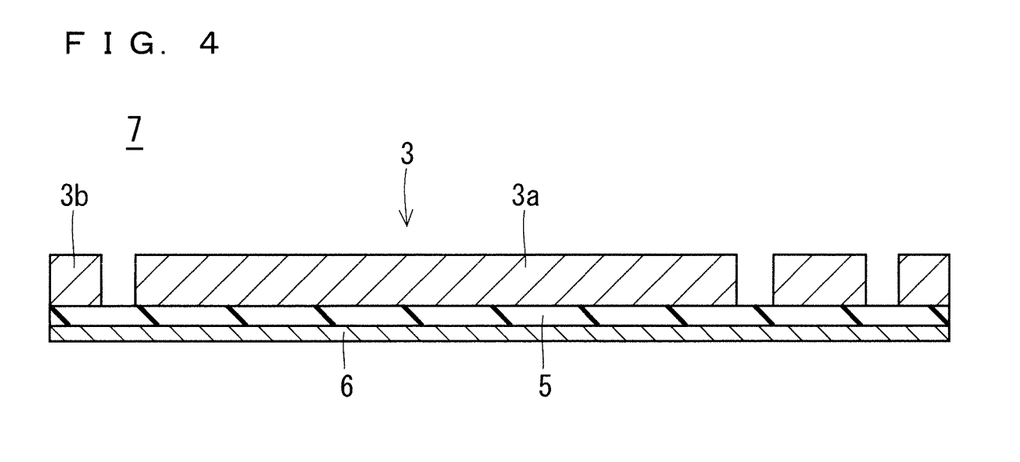
FIG. 4 is a cross-sectional view illustrating the insulating substrate included in the semiconductor device according to Embodiment 1.

Embodiment 1 of the present invention will be described with reference to the drawings. FIG. 1 is a cross-sectional view illustrating a semiconductor device 202 according to Embodiment 1. FIG. 2 is a plan view of an insulating substrate 7 included in the semiconductor device 202. FIG. 3 is a plan view of the semiconductor device 202. FIG. 4 is a cross-sectional view of the insulating substrate 7 included in the semiconductor device 202.

As illustrated in FIG. 1, the semiconductor device 202 includes the insulating substrate 7, semiconductor chips 1 and 2, a case 10, terminals 12 and 13, and a sealing material 14.

The insulating substrate 7 includes an insulating layer 5, an upper conductor portion 3, and a lower conductor portion 6. The insulating layer 5 is formed of, for example, an epoxy resin. The upper conductor portion 3 is provided on the upper surface of the insulating layer 5, and the lower conductor portion 6 is provided on the lower surface of the insulating layer 5.

The semiconductor chips 1 and 2 are disposed on the upper surface of the insulating substrate 7 at a distance from each other, and fixed through solders 8. Although it is not particularly limited, the semiconductor chip 1 is, for example, a transistor chip such as an IGBT, and the semiconductor chip 2 is a diode chip.

As illustrated in FIGS. 1 and 3, the case 10 includes a peripheral wall portion 10a having a rectangular frame shape in plan view, and surrounds the insulating substrate 7 and the semiconductor chips 1 and 2. The lower portion of the peripheral wall portion 10a protrudes toward the inner peripheral side. A concave portion 10b into which the outer peripheral portion of the insulating substrate 7 can be fitted is formed over the entire area of the inner peripheral portion at the lower end portion of the peripheral wall portion 10a.

A collar portion 10c protruding outward from the entire area of the outer peripheral portion of the lower end portion of the peripheral wall portion 10a is formed. A plurality of (for example, two) attachment holes 10d are formed in the collar portion 10c, through which heat radiation fins (not shown) as a cooler is attachable. Thereby, the stress at the time of attachment of the radiation fins can be dispersed to the collar portion 10c, and the damage to the insulating layer 5 of the insulated substrate 7 can be suppressed.

The terminals 12 and 13 are formed of, for example, a thin copper plate in an L shape in cross section. The terminals 12 and 13 are provided integrally with the case 10 by insert molding. One end portions of the terminals 12 and 13 are exposed to the outside from the upper end portion of the peripheral wall portion 10a, and are connected to an external device. The other end portion of the terminal 12 is exposed to the inner peripheral side from the central portion in the vertical direction of the peripheral wall portion 10a, and is connected to the semiconductor chip 1 through a wirebond 9b. The other end portion of the terminal 13 is exposed to the inner peripheral side from the central portion in the vertical direction of the peripheral wall portion 10a, and is connected to the semiconductor chips 1 and 2 through a wirebond 9a.

The sealing material 14 is, for example, a thermosetting resin. The sealing material 14 is filled in the inside of the case 10 and sealed so as to cover the entire surface of the insulating substrate 7, including the semiconductor chips 1 and 2 and the wirebonds 9a and 9b in the inside of the case 10.

Next, details of the upper conductor portion 3 of the insulating substrate 7 will be described. As illustrated in FIGS. 1, 2 and 4, the upper conductor portion 3 includes a circuit pattern 3a and an outer peripheral pattern 3b.

The circuit pattern 3a is formed of, for example, copper, and includes a square portion in a plan view and elongated rectangular portions which are adjacent to the square portion at a certain distance from the square portion in a plan view. The semiconductor chips 1 and 2 are arranged on the square portion in plan view.

The outer peripheral pattern 3b is formed of, for example, copper. The outer peripheral pattern 3b is provided on the outer peripheral side of the circuit pattern 3a at a certain gap, and has a square shape in plan view. The distance between the outer peripheral pattern 3b and the circuit pattern 3a is desirably determined by the voltage required for the semiconductor device 202 and the withstand voltage of the sealing material 14. The distance between the patterns is desirably 1 mm or more in a region where the withstand voltage is 650 V or more and 2 kV or less.

As illustrated in FIG. 1, the outer peripheral portion of the insulating substrate 7 is fixed into the concave portion 10b of the peripheral wall portion 10a of the case 10 through an adhesive 11. More specifically, the insulating substrate 7 is fixed into the concave portion 10b of the case 10 through the adhesive 11 applied to the upper surface of the outer peripheral pattern 3b of the upper conductor portion 3. Thus, damage to the insulating layer 5 caused by an external force applied to the semiconductor device 202 can be dispersed in the case 10 and the outer peripheral pattern 3b.

For example, the thickness A of the upper conductor portion 3 is 1 mm or more and 3 mm or less, the thickness B of the lower conductor portion 6 is 0.2 mm or more and 2 mm or less, making the thickness A of the upper conductor portion 3 is larger than the thickness B of the lower conductor portion 6. These thicknesses can be designed according to the heat radiation and strength of the insulating substrate 7. The thickness of the circuit pattern 3a and the thickness of the outer peripheral pattern 3b are the same; therefore, the thickness A of the upper conductor portion 3 is the thickness of the circuit pattern 3a and is also the thickness of the outer peripheral pattern 3b.

As illustrated in FIGS. 1 to 4, the outermost end of the insulating layer 5 in plan view coincides with the outermost end of the upper conductor portion 3 in plan view and the outermost end of the lower conductor portion 6 in plan view. Thereby, the outer peripheral portion of the insulating layer 5 does not protrude from the upper conductor portion 3 and the lower conductor portion 6. If the insulating layer 5 protrudes from the upper conductor portion 3 and the lower conductor portion 6, an external force is applied to the insulating layer 5, whereby the insulating layer 5 is broken, which may lead to a dielectric breakdown from that point. However, having no protrusion of the outer peripheral portion of the insulating layer 5 from the upper conductor portion 3 and the lower conductor portion 6, the insulating layer 5 can be protected. The case where "the outermost end of the insulating layer 5 in plan view coincides with the outermost end of the upper conductor portion 3 in plan view and the outermost end of the lower conductor portion 6 in plan view" includes the case where the outermost end of the insulating layer 5 in a plan view is inside slightly the outermost end of the upper conductor portion 3 in a plan view and the outermost end of the lower conductor portion 6 in a plan view.

Note that in the case where a three-phase inverter circuit is formed using the semiconductor device 202, six transistor chips and six diodes connected in antiparallel to the six transistor chips are provided. As the semiconductor chips 1 and 2, the ones manufactured from a wafer of Si, GaN, SiC or the like are used. Although the material of the semiconductor chips 1 and 2 is not particularly limited, when the semiconductor chips 1 and 2 are manufactured from a wafer such as SiC for high current density and high frequency operation, high heat dissipation by thickening copper of the circuit pattern 3a is effective.

Or, the solder 8 may be replaced by another bonding material (method). For example, replacing with sinter bonding of Ag ensures to improve reliability such as the heat dissipation and the power cycle as compared to the soldering.

As described above, in the semiconductor device 202 according to Embodiment 1, the upper conductor portion 3 includes the circuit pattern 3a on which the semiconductor chips 1 and 2 are disposed and the outer peripheral pattern 3b provided spaced apart on the outer peripheral side of the circuit pattern 3a; therefore, the rigidity of the outer peripheral portion of the insulating substrate 7 can be enhanced. The thickness A of the outer peripheral pattern 3b of the upper conductor portion 3 is larger than the thickness B of the lower conductor portion 6, and the outer peripheral pattern 3b of the upper conductor portion 3, the outer peripheral portion of the insulating layer 5, and the outer peripheral portion of the lower conductor portion 6 are fixed into the concave portion 10b formed in the inner peripheral portion of the peripheral wall portion 10a of the case 10. Therefore, the concave portion 10b of the peripheral wall portion 10a of the case 10 and the outer periphery of the insulating substrate 7 whose rigidity is enhanced by providing the outer peripheral pattern 3b can be fixed. Thus, external force applied to the semiconductor device 202 can be dispersed, and damage to the insulating layer 5 can be suppressed.

Furthermore, the collar portion 10c projecting outward from the outer peripheral portion of the peripheral wall portion 10a of the case 10 is formed, and the attachment holes 10d through which the radiation fins are attachable are formed in the collar portion 10c. Therefore, the stress at the time of attachment of the radiation fins can be dispersed to the collar portion 10c, and the damage to the insulating layer 5 can be suppressed.

Further, the thickness B of the lower conductor portion 6 which does not contribute much to the heat dissipation is formed thinner than the thickness A of the upper conductor portion 3. Therefore, reduction of the weight of the semiconductor device 202 is ensured. As described above, the semiconductor device 202 which ensures both the weight reduction and securing necessary strength thereof can be realized.

Further, the thickness A of the upper conductor portion 3 is larger than the thickness B of the lower conductor portion 6; accordingly, the thickness of the circuit pattern 3a is increased. Therefore, the heat dissipation of the insulating substrate 7 can be improved.

The outermost end of the insulating layer 5 in plan view coincides with the outermost end of the upper conductor portion 3 in plan view and the outermost end of the lower conductor portion 6 in plan view. Therefore, the outer peripheral portion of the insulating layer 5 does not protrude from the upper conductor portion 3 and the lower conductor portion 6. Thereby, the insulating layer 5 can be protected from, for example, defects and scratches that may occur in the process of manufacturing (assembling) the semiconductor device 202.

When the semiconductor chips 1 and 2 are formed using SiC as a material, the characteristics of SiC such as high current density and high frequency operation can be utilized by achieving high heat dissipation by thickening copper of the circuit pattern 3a.

Embodiment 2

Figure 5:
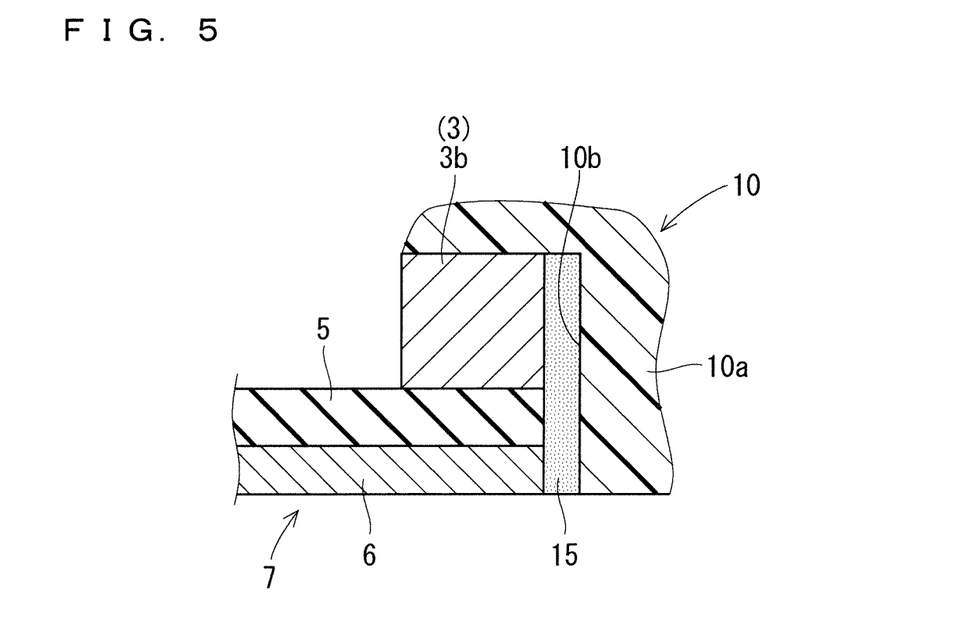
FIG. 5 is a cross-sectional view illustrating a fixed state of an insulating substrate and a case included in a semiconductor device according to Embodiment 2.

Next, a semiconductor device according to Embodiment 2 will be described. FIG. 5 is a cross-sectional view illustrating a fixed state of an insulating substrate 7 and a case 10 included in a semiconductor device according to Embodiment 2. It should be noted that, in Embodiment 2, the same components as those described in Embodiment 1 are denoted by the same reference numerals, and the description thereof is omitted.

As illustrated in FIG. 5, in Embodiment 2, the insulating substrate 7 includes a conductive paste 15 for conducting between the outer peripheral pattern 3b of the upper conductor portion 3 and the outer peripheral portion of the lower conductor portion 6. In Embodiment 1, the outer peripheral pattern 3b is at a floating potential as the outer peripheral pattern 3b is not connected to the circuit pattern 3a. Whereas, in Embodiment 2, the conductive paste 15 is disposed for stabilizing electrically by conducting the outer peripheral pattern 3b.

The conductive paste 15 is disposed on the entire or part of the outer peripheral surface of the outer peripheral pattern 3b of the upper conductor portion 3, the outer peripheral surface of the insulating layer 5, and the outer peripheral surface of the lower conductor portion 6. As conductive paste 15, a mixture made by mixing metal powders such as Ag, Al, or Fe into synthetic resins such as silicone or an epoxy is used. Although the conductive paste 15 may have an adhesive function to substitute for the adhesive 11, the adhesive 11 may be disposed in the same manner as in FIG. 1 without giving the conductive paste 15 an adhesive function. FIG. 5 is a diagram in the case where the conductive paste 15 has the adhesive function.

As described above, in the semiconductor device according to Embodiment 2, the insulating substrate 7 has the conductive paste 15 for conducting between the outer peripheral pattern 3b of the upper conductor portion 3 and the outer peripheral portion of the lower conductor portion 6. Therefore, the semiconductor device can be electrically stabilized by conducting the outer peripheral pattern 3b.

Embodiment 3

In Embodiment 3, the semiconductor device 202 according to Embodiment 1 is applied to a power conversion apparatus. Although the present invention is not limited to a specific power conversion apparatus, hereinafter, the case where the present invention is applied to a three-phase inverter will be described as Embodiment 3.

Figure 6:
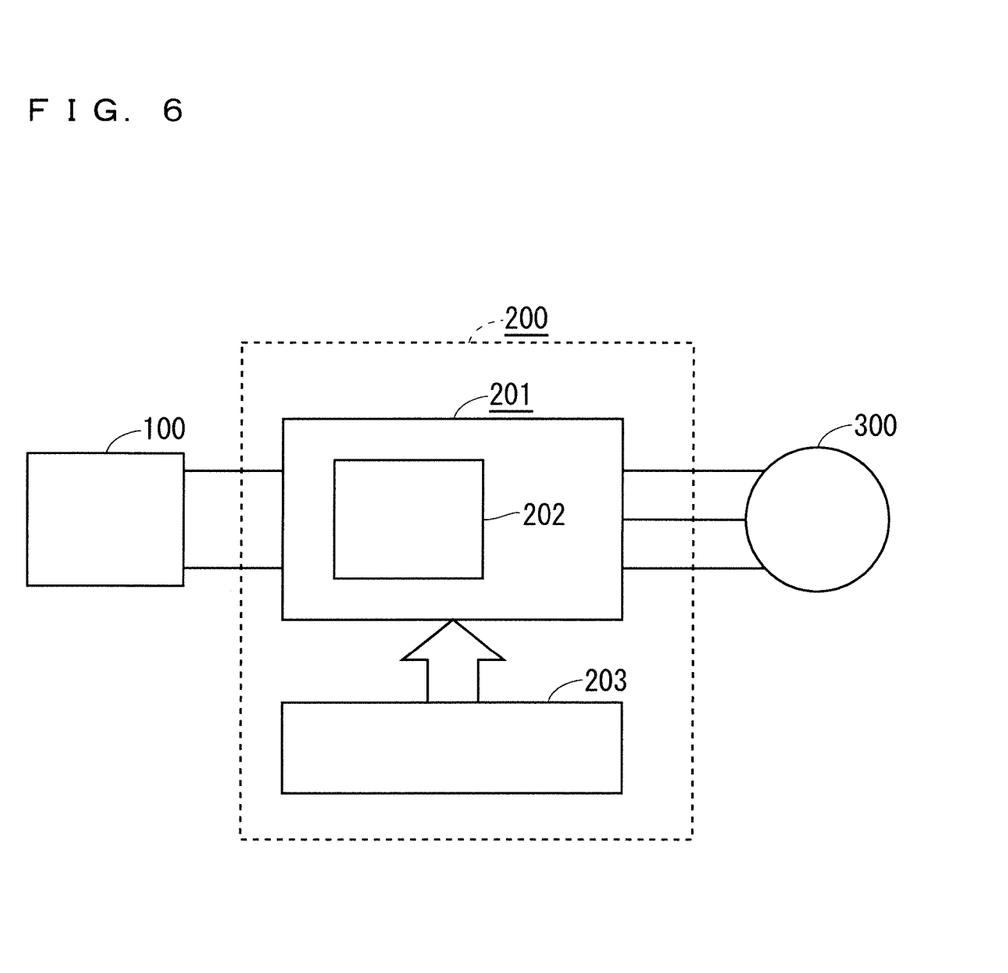
FIG. 6 is a block diagram illustrating a configuration of a power conversion system to which a power conversion apparatus according to Embodiment 3 is applied.

FIG. 6 is a block diagram illustrating a configuration of a power conversion system to which a power conversion apparatus according to Embodiment 3 is applied.

The power conversion system illustrated in FIG. 6 includes a power source 100, a power conversion apparatus 200, and a load 300. The power source 100 is a DC power source and supplies DC power to the power conversion apparatus 200. The power source 100 can be various types, such as a DC system, a solar cell, a storage battery, alternatively, the power source 100 may include a rectifier circuit or an AC/DC converter connected to an AC system. Further, the power source 100 may include a DC/DC converter that converts DC power output from the DC system into predetermined electric power.

The power conversion apparatus 200 is a three-phase inverter connected between the power source 100 and the load 300, and converts DC power supplied from the power source 100 into AC power then supplies the AC power to the load 300. As illustrated in FIG. 6, the power conversion apparatus 200 includes a main conversion circuit 201 that converts DC power into AC power and outputs the converted power, and a control circuit 203 that outputs a control signal for controlling the main conversion circuit 201 to the main conversion circuit 201.

The load 300 is a three-phase motor driven by AC power supplied from the power conversion apparatus 200. It should be noted that, the load 300 is not limited to a specific use, and is a motor mounted in various electric apparatuses, for example, the load 300 is used as a motor for hybrid vehicles, electric vehicles, railway vehicles, elevators, or air conditioning apparatuses.

Hereinafter, details of the power conversion apparatus 200 will be described. The main conversion circuit 201 includes a switching device and a freewheel diode (not illustrated), the switching device converts DC power supplied from the power source 100 into AC power by switching and supplies the power to the load 300. There are various specific circuit configurations of the main conversion circuit 201, and the main conversion circuit 201 according to Embodiment 3 is a two-level three-phase full-bridge circuit which can be composed of six switching devices and six freewheel diodes each of which is connected in antiparallel to the respective switching devices. Each switching device and each freewheel diode of the main conversion circuit 201 are configured by the semiconductor device corresponding to either of Embodiments 1 and 2 described above. Here, a configuration with the semiconductor device 202 according to Embodiment 1 will be described. In the six switching devices, for each pair of switching devices, an upper arm and a lower arm are formed by connecting the switching devices in series, and each pair of upper arm and lower arm constitutes each phase (U-phase, V-phase, W-phase) of the full bridge circuit. And, an output terminal of each pair of upper arm and lower arm, that is, three output terminals of the main conversion circuit 201 are connected to the load 300.

In addition, although the main conversion circuit 201 includes a drive circuit (not shown) for driving each switching device, the drive circuit may be built in the semiconductor device 202, or the drive circuit may be provided separately from the semiconductor device 202. The drive circuit generates a drive signal for driving each switching device of the main conversion circuit 201 and supplies the signal to a control electrode of the switching device of the main conversion circuit 201. Specifically, in accordance with the control signal from the control circuit 203 which will be described later, the drive circuit outputs a drive signal for turning each switching device to the ON state and a drive signal for turning each switching device to the OFF state to the control electrode of each switching device. When the switching device is maintained in the ON state, the drive signal is a voltage signal (ON signal) equal to or higher than a threshold voltage of the switching device, and when the switching device is maintained in the OFF state, the drive signal is a voltage signal (OFF signal) equal to or lower than the threshold voltage of the switching device.

The control circuit 203 controls the switching devices of the main conversion circuit 201 so that desired power is supplied to the load 300. Specifically, the control circuit 203 calculates the time (ON time) at which each switching device of the main conversion circuit 201 should be in the ON state based on the power to be supplied to the load 300. For example, the main conversion circuit 201 can be controlled by PWM control for modulating the ON time for the switching devices according to the voltage to be output. Then, a control command (control signal) is output to the drive circuit so that an ON signal is output to the switching devices to be ON state, and an OFF signal is output to the switching devices to be OFF state at each point of time. In accordance with the control signal, the drive circuit outputs the ON signal or the OFF signal as the drive signal to the control electrode of each switching device.

In the power conversion apparatus according to Embodiment 3, improvement in reliability thereof is realized as the semiconductor device 202 according to Embodiment 3 is applied to the switching devices and the freewheel diodes of the main conversion circuit 201.

In Embodiment 3, although an example in which the present invention is applied to a two-level three-phase inverter has been described, the present invention is not limited to this and can be applied to various power conversion apparatuses. In Embodiment 3, although a two-level power conversion apparatus is applied, a three-level or multi-level power conversion apparatus may be applied, and when supplying power to a single-phase load, the present invention may be applied to a single-phase inverter. In the case where power is supplied to a direct current load and so forth, the present invention can also be applied to a DC/DC converter or an AC/DC converter.

In addition, the power conversion apparatus to which the present invention is applied is not limited to the case where the above-described load is an electric motor, and may be applied to, for example, power source equipment of an electric discharge machine, a laser processing machine, an induction heating cooker or a non-contact power supply system, and further, can also be used as a power conditioner for a photovoltaic power generation system, a power storage system or the like, for example.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   an insulating substrate having an insulating layer, an upper conductor portion provided on an upper surface of the insulating layer, and a lower conductor portion provided on a lower surface of the insulating layer;
   semiconductor chips disposed on an upper surface of the insulating substrate;
   a case surrounding a side of the insulating substrate and a side of the semiconductor chips thereby defining an inside portion; and
   a sealing material sealing the inside portion of the case, the upper conductor portion having a thickness larger than a thickness of the lower conductor portion,
   the upper conductor portion including a circuit pattern on which the semiconductor chips are disposed and an outer peripheral pattern provided on an outer peripheral side of the circuit pattern at a certain gap,
   the outer peripheral pattern of the upper conductor portion, an outer peripheral portion of the insulating layer, and an outer peripheral portion of the lower conductor portion being fixed into a concave portion formed in an inner peripheral portion of a peripheral wall portion of the case, a collar portion protruding outward from an outer peripheral portion of the peripheral wall portion of the case being formed, mounting holes, through which a cooler is attachable, being formed on the collar portion, and the insulating substrate further includes a conductive paste configured to conduct between the outer peripheral pattern of the upper conductor portion and the outer peripheral portion of the lower conductor portion.

2. The semiconductor device according to claim 1, wherein an outermost end of the insulating layer in plan view coincides with an outermost end of the upper conductor portion in plan view and an outermost end of the lower conductor portion in plan view.

3. The semiconductor device according to claim 1, wherein the semiconductor chips are made of SiC as a material thereof.

4. A power conversion apparatus, comprising:

a main conversion circuit including the semiconductor device according to claim 1, and configured to convert and output power to be input; and a control circuit configured to output a control signal for controlling the main conversion circuit to the main conversion circuit.

5. The semiconductor device according to claim 1, wherein the inner peripheral portion of the peripheral wall portion of the case has a projection that protrudes into an interior of the case, such that a surface of the projection facing the outer peripheral pattern of the upper conductor portion and a surface of the inner peripheral portion facing the interior of the case define the concave portion.

6. The semiconductor device according to claim 1, wherein the cooler is attached to the collar portion by the mounting holes.

7. The semiconductor device according to claim 1, wherein the outer peripheral pattern of the upper conductor portion, the outer peripheral portion of the insulating layer, and the outer peripheral portion of the lower conductor portion extend into the concave portion formed in the inner peripheral portion of the peripheral wall portion of the case and are fixed into the concave portion.

8. A semiconductor device, comprising:

an insulating substrate having an insulating layer, an upper conductor portion provided on an upper surface of the insulating layer, and a lower conductor portion provided on a lower surface of the insulating layer;

semiconductor chips disposed on an upper surface of the insulating substrate;

a case surrounding a side of the insulating substrate and a side of the semiconductor chips thereby defining an inside portion; and a sealing material sealing the inside portion of the case, the upper conductor portion having a thickness larger than a thickness of the lower conductor portion, the upper conductor portion including a circuit pattern on which the semiconductor chips are disposed and an outer peripheral pattern provided on an outer peripheral side of the circuit pattern at a certain gap, the outer peripheral pattern of the upper conductor portion, an outer peripheral portion of the insulating layer, and an outer peripheral portion of the lower conductor portion being fixed into a concave portion formed in an inner peripheral portion of a peripheral wall portion of the case, a collar portion protruding outward from an outer peripheral portion of the peripheral wall portion of the case being formed, mounting holes, through which a cooler is attachable, being formed on the collar portion, and an upper surface of the outer peripheral pattern of the upper conductor portion is positioned further upward toward an upper end of the case than an upper surface of the collar portion, and a lower surface of the outer peripheral pattern of the upper conductor portion is positioned further downward from the upper end of the case than the upper surface of the collar portion.

9. A semiconductor device, comprising:

an insulating substrate having an insulating layer, an upper conductor portion provided on an upper surface of the insulating layer, and a lower conductor portion provided on a lower surface of the insulating layer;

semiconductor chips disposed on an upper surface of the insulating substrate;

a case surrounding a side of the insulating substrate and a side of the semiconductor chips thereby defining an inside portion; and a sealing material sealing the inside portion of the case, the upper conductor portion having a thickness larger than a thickness of the lower conductor portion, the upper conductor portion including a circuit pattern on which the semiconductor chips are disposed and an outer peripheral pattern provided on an outer peripheral side of the circuit pattern at a certain gap, the outer peripheral pattern of the upper conductor portion, an outer peripheral portion of the insulating layer, and an outer peripheral portion of the lower conductor portion being fixed into a concave portion formed in an inner peripheral portion of a peripheral wall portion of the case, a collar portion protruding outward from an outer peripheral portion of the peripheral wall portion of the case being formed, mounting holes, through which a cooler is attachable, being formed on the collar portion, and the outer peripheral pattern of the upper conductor portion, the outer peripheral portion of the insulating layer, and the outer peripheral portion of the lower conductor portion contact an inner wall of the peripheral wall portion of the case that is opposite to an outer wall of the outer peripheral portion of the peripheral wall portion of the case from which the collar portion protrudes.

* * * * *